United States Patent [19]

Tani

[11] Patent Number: 5,432,113
[45] Date of Patent: Jul. 11, 1995

[54] METHOD OF MAKING A SEMICONDUCTOR MEMORY DEVICE

[75] Inventor: Tomofune Tani, Sagamihara, Japan

[73] Assignee: Nippon Steel Corporation, Tokyo, Japan

[21] Appl. No.: 102,008

[22] Filed: Aug. 4, 1993

[30] Foreign Application Priority Data

Aug. 4, 1992 [JP] Japan .................. 4-208213

[51] Int. Cl.6 .......................... H01L 21/8229
[52] U.S. Cl. ........................... 437/52; 437/60; 437/69
[58] Field of Search ............. 437/47, 48, 52, 60, 437/69, 192, 205, 233, 235; 257/303

[56] References Cited

U.S. PATENT DOCUMENTS

| 4,855,953 | 8/1989 | Tsukamoto et al. | 365/149 |
| 5,198,386 | 3/1993 | Gonzalez | 437/233 |
| 5,258,321 | 11/1993 | Shimizu et al. | 437/52 |
| 5,273,928 | 12/1993 | Tani | 437/60 |

FOREIGN PATENT DOCUMENTS

| 0076856 | 5/1982 | Japan | 437/69 |
| 58-186 | 1/1983 | Japan | 437/69 |
| 0175844 | 10/1983 | Japan . | |
| 0287258 | 12/1986 | Japan | 237/302 |
| 63-302536 | 12/1988 | Japan . | |
| 0307743 | 12/1988 | Japan | 437/69 |
| 0214142 | 8/1989 | Japan | 437/69 |

OTHER PUBLICATIONS

Isolation Process Using Polysilicon Buffer Layer for Scaled MOS/VSLI, Yu-Pin Han and Ring Ma, The Electrochemical Society Extended Abstract, 1984.

Primary Examiner—Tom Thomas
Attorney, Agent, or Firm—Pollock, Vande Sande & Priddy

[57] ABSTRACT

A method of manufacturing a semiconductor memory device including at least one memory cell having a transistor and a capacitor, forming at least one trench in a surface of a semiconductor substrate, forming a semiconductor film covering the surface of the semiconductor substrate and an inner wall of the trench, forming an oxidation-resistant film to cover at least a first part of the semiconductor film covering the inner wall of the trench including a bottom surface of the trench, and oxidizing a second part of the semiconductor film, which is not covered by the oxidation-resistant film, thereby to form an element isolation insulating film.

3 Claims, 5 Drawing Sheets

FIG. IG
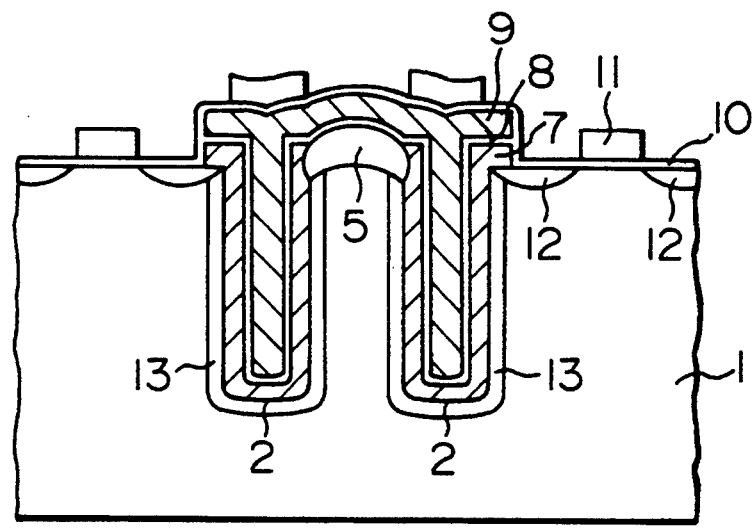
FIG. 2A
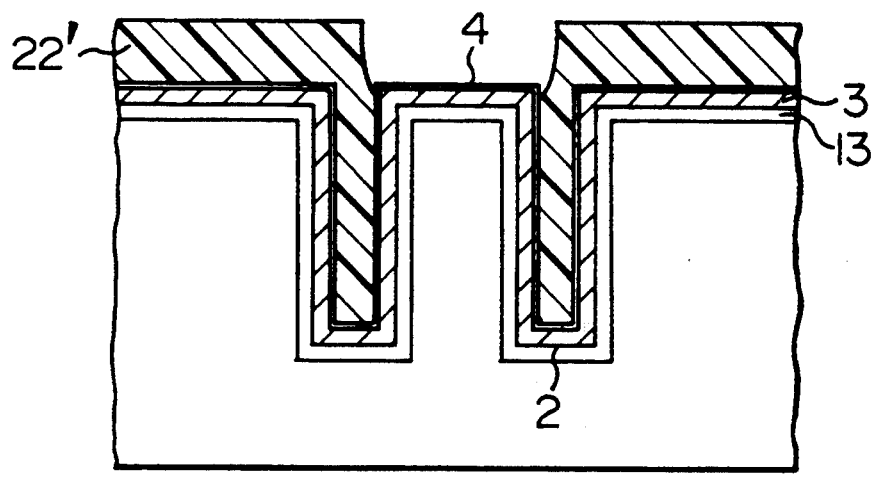

5,432,113

METHOD OF MAKING A SEMICONDUCTOR MEMORY DEVICE

BACKGROUND OF THE INVENTION

1. Field of the Invention

This invention relates to a semiconductor memory device and to a method of fabricating the same. More particularly, it relates to a DRAM having memory cells, each including a capacitor and to a transistor and a method of fabricating the same.

2. Description of the Related Art

In a conventional method of fabricating a semiconductor memory device having memory cells, an element isolation insulating film is formed on the surface of a semiconductor substrate by LOCOS process and then the memory cells are formed. However, since bird's beaks develop during the formation of this element isolation insulating film, the prior art method involves a problem that a semiconductor memory device having memory cells integrated at a high density cannot be fabricated so easily.

To solve this problem, as disclosed, for example, in "Isolation Process Using Polysilicon Buffer Layer for Scaled MOS/VSLI", Yu-Pin Han and Ring Ma, The Electrochemical Society Extended Abstract, 1984 and JP-A-63-302536, an improved LOCOS process using a polysilicon buffer layer for the formation of the element isolation insulating film has been proposed to reduce the bird's beaks.

A method of fabricating a semiconductor memory device using a polysilicon buffer layer will be explained with reference to FIGS. 3A and 3B. First of all, an element isolation insulating film 102 is formed on the surface of a silicon substrate 101 by an improved LOCOS process using a polysilicon buffer layer as shown in FIG. 3A, and capacitor trenches 103 are then formed by a reactive ion etching (RIE) process. Next, a first capacitor electrode film 104, a capacitor insulating film 105, a second capacitor electrode film 106, a gate insulating film 107, a gate electrode 108 and diffusion layers 109 to serve as drain and source regions of a transistor are successively formed.

According to this method using the polysilicon buffer layer, however, the step of forming the polysilicon layer is necessary. Therefore, the steps become more complicated, and a design margin is necessary in consideration of an alignment error of a mask at the exposure step of forming the element isolation insulating film and deviation in the process. For these reasons, there is a limit in reducing the width of the element isolation insulating film, and it is indeed difficult to satisfactorily integrate the memory cells at a high density.

SUMMARY OF THE INVENTION

An object of the present invention is to provide a semiconductor memory device including at least one memory cell having a transistor and a trench capacitor, wherein the memory cell is formed in a limited area on a semiconductor substrate.

Another object of the invention is to provide a method of fabricating a semiconductor memory device including at least one memory call having a transistor and a capacitor in which the memory cell is formed in a limited area on a semiconductor substrate.

To achieve the above object, according to the present invention, a semiconductor memory device, which includes at least one memory cell having a transistor and a trench capacitor, comprises a semiconductor substrate having a surface in which at least one trench is formed so as to define two areas on the surface of the semiconductor substrate separated by the trench; a transistor having source and drain regions formed on the surface of the semiconductor substrate at its first area disposed at one of two opposite sides of and adjacent to the trench; a polysilicon layer formed to be in contact with one of the source and drain regions and to extend over an inner surface of the trench and a second area of the surface of the semiconductor substrate disposed at the other side of the trench; and a silicon dioxide region formed by oxidizing a part of the polysilicon layer extending on the second area of the surface of the semiconductor substrate.

According to the present invention, a method of fabricating a semiconductor memory device, which includes at least one memory cell having a transistor and a capacitor, comprises the steps of: forming at least one trench in a surface of a semiconductor substrate; forming a semiconductor film so as to cover the surface of the semiconductor substrate and an inner wall of the trench; and processing the semiconductor film to form an element isolation insulating film and a conductor film serving as one of electrodes of the capacitor.

In the method of fabricating a semiconductor memory device including at least one memory cell having a transistor and a capacitor according to the present invention, since the element isolation insulating film is formed after the trench or trenches are formed, the width of the element isolation insulating film is limited and the occurrence of the bird's beaks is restricted by the trench so that the element isolation insulating film can be formed in a sufficiently small size with reduced bind's beaks. Further, the design margin for the alignment error of the mask at the exposure step of forming the element isolation insulating film and for process deviation, which has been necessary in the prior art method, can be reduced in the method of the present invention. Therefore, the memory cells can be easily integrated at a high density. Furthermore, since the element isolation insulating film and one of the electrode films of the trench capacitor can be formed of the same semiconductor film, the fabrication steps can be simplified.

BRIEF DESCRIPTION OF THE DRAWINGS

FIGS. 1A to 1G are sectional views of a part of a semiconductor memory device at the respective steps in a method according to a first embodiment of the present invention;

FIGS. 2A to 2D are sectional views of a part of the semiconductor memory device at the respective steps, different from those of the first embodiment, in a method according to a second embodiment of the present invention.

DESCRIPTION OF THE PREFERRED EMBODIMENTS

The first embodiment of the present invention will be described with reference to FIGS. 1A to 1G.

Figure 1A:
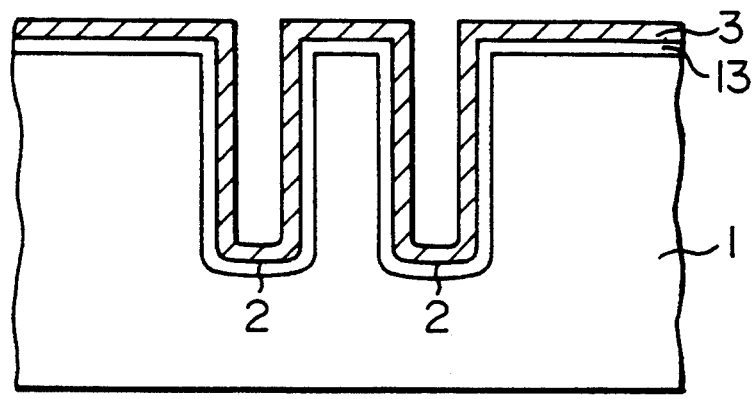

In this embodiment, capacitor trenches 2 are first formed in a silicon substrate 1 having one conductivity type by a reactive ion etching (RIE) process, for example, as shown in FIG. 1A. The capacitor trench 2 has a diameter of 0.3 to 2 μm and a depth of 0.5 to 6 μm, for example. Next, the surface of the semiconductor substrate 1 is subjected to thermal-oxidization thereby forming an insulating oxide film thereon at a thickness of 10 to several tens of nm. Next, a semiconductor film 3 is deposited on the entire surface of the silicon substrate 1 by a CVD process, for example. The material of the semiconductor film 3 is poly-silicon, for example, and its thickness is about 10 to 100 nm, for example.

Figure 1B:
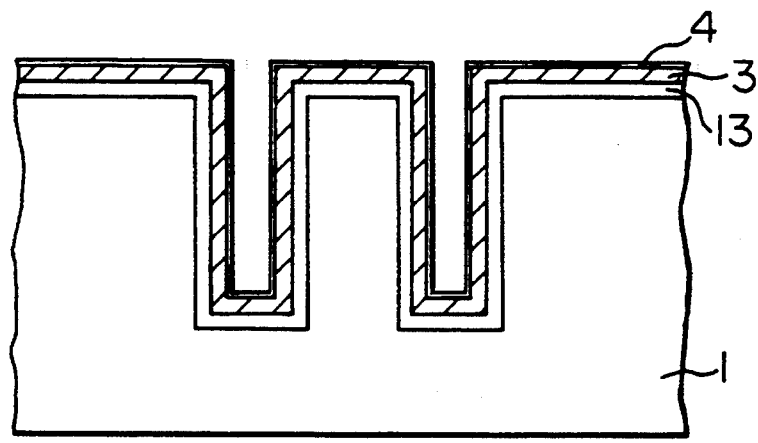
Figure 1C:
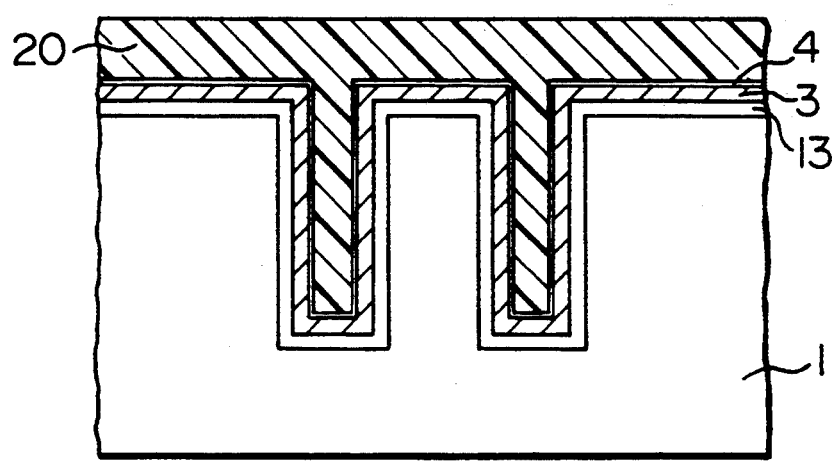
Figure 1D:
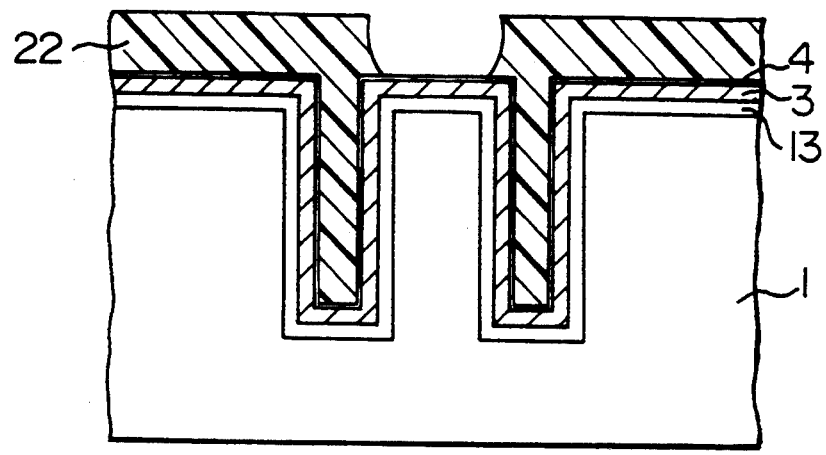
Figure 1E:
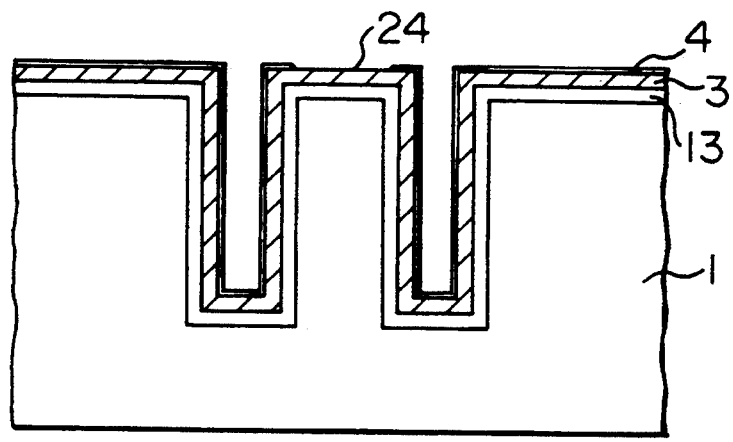
Figure 1F:
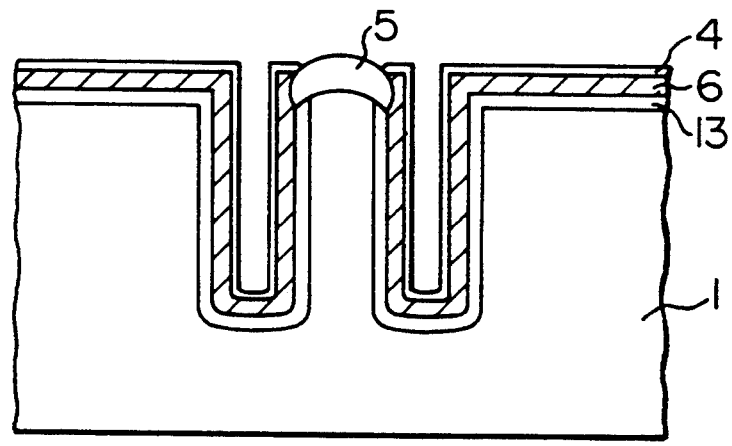

Thereafter, an oxidation-resistant film 4 is formed on the entire surface of the silicon substrate 1 by the CVD process, for example, as shown in FIG. 1B. The material of this oxidation-resistant film 4 is silicon nitride, for example. A resist film 20 is then coated on the entire surface of the oxidation-resistant film 4 (FIG. 1C). Only a portion of the resist film 20 corresponding to a part of the surface of the semiconductor substrate 1 disposed between the trenches is etched by photolithography to form a mask 22 of the resist film (FIG. 1D). The portion of the oxidation-resistant film 4 not covered by the mask 22 is removed by dry etching, and then the mask 22 of the resist film is removed (FIG. 1E). Next, the portion 24 of the semiconductor film 3 is subjected to thermal oxidation using the oxidation-resistant film 4 as a mask, thereby forming an element isolation film 5 (FIG. 1F).

Figure 3A:
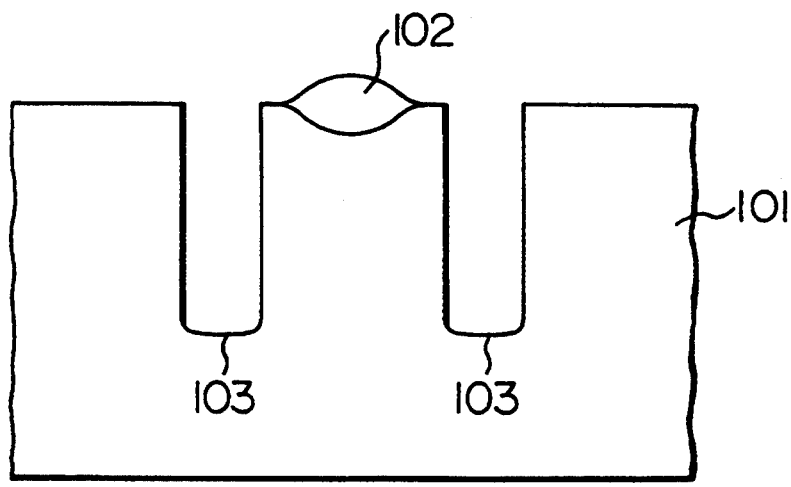
FIGS. 3A and 3B are sectional views of a semiconductor memory device at the respective steps in a prior art method.
Figure 3B:
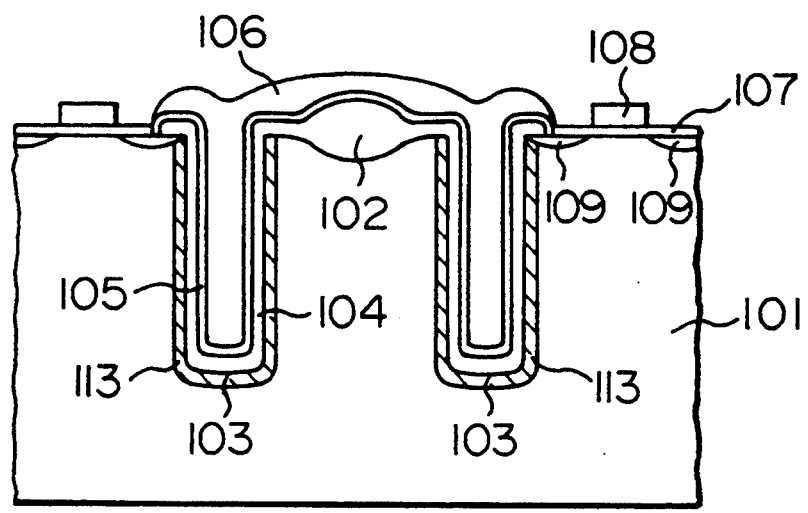

The conventional element isolation insulating film 102 is formed, as shown in FIGS. 3A and 3B, to extend partially inside the semiconductor substrate 101. On the other hand, the element isolation insulating film 5 is formed by thermal-oxidization of the semiconductor film 3 so that the element isolation insulating film 5 projects by expansion upward relative to a level of the surface of the semiconductor substrate 1 and extends at each of both edges thereof downward into the adjacent trench because the thermal oxidation is blocked by the edge of the oxidation-resistant film 4 and advances downward along the inner wall of the trench.

Next, as shown in FIG. 1G, the oxidation-resistant film 4 is removed by etching, and the remaining portion 6 of the semiconductor film 3 is patterned to form a first capacitor electrode 7.

Thereafter, a capacitor insulating film 8, a second capacitor electrode 9, a gate insulating film 10, a gate electrode 11 and diffusion layers 12 serving as the drain and source regions of a transistor are successively formed. In this way, a charge storage capacitor comprising the first capacitor electrode 7, the capacitor insulating film 8 and the second capacitor electrode 9, and a transistor comprising the gate electrode 11, the gate insulating film 10 and the diffusion layers 12 serving as the source and drain regions is formed.

Thereafter, an inter-layer insulating film, a bit contact, a bit wire, an inter-layer insulating film, a backing wiring of the gate electrode and a passivation film (not shown) are successively formed by a known process, and a semiconductor memory device is completed.

According to the first embodiment of the present invention described above, the element isolation film 5 and the first capacitor electrode 7 are formed of the same semiconductor film 3 by one step. For this reason, the fabrication process can be simplified in comparison with the prior art process. A margin for a position error in alignment of the mask with the capacitor trench 2 for formation of the element isolation insulating film 5 and a margin for deviations in the fabrication process can be reduced, and the bird's beaks of the element isolation insulating film 5 can be reduced because it is restricted by the trenches. Accordingly, the memory cells in the semiconductor memory device can be integrated at a higher density.

Figure 2B:
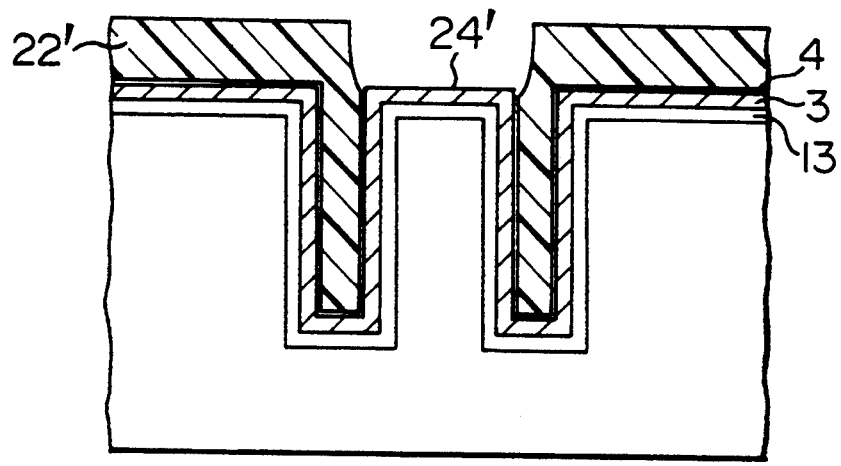
Figure 2C:
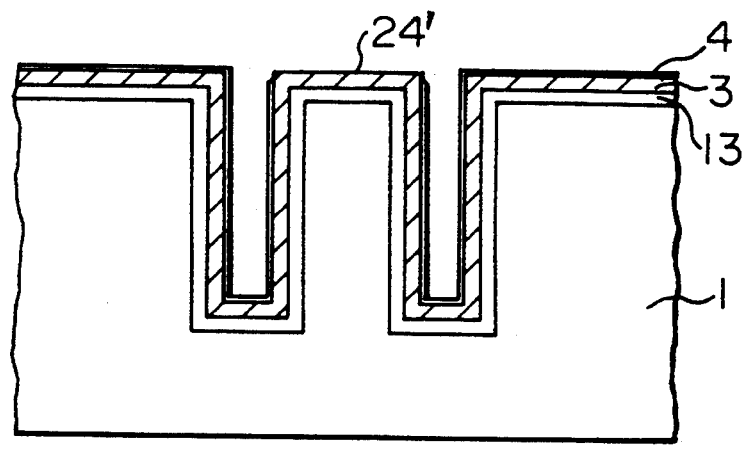

Next, the second embodiment of the present invention will be explained with reference to FIGS. 2A to 2D. The steps of the first embodiment shown in FIGS. 1A to 1C are carried out similarly in this second embodiment. FIG. 2A shows the step corresponding to the step shown in FIG. 1D. In the second embodiment, the portion of the photoresist 20 to be removed is greater than that in the first embodiment, and a mask 22' is formed by removing the portion having a greater width than the width between the two trenches 2. At this time, the removed open portion of the photoresist is greater than the width between the trenches, but it does not reach a large depth of the trenches but remains at shallow portions. Accordingly, no serious problem exists even when accuracy of alignment of the mask 22' is low. Next, the portion of the oxidation-resistant film 4 not covered by the mask 22' is removed by dry etching so as to expose the portion 24' of the semiconductor film (FIG. 2B).

Figure 2D:
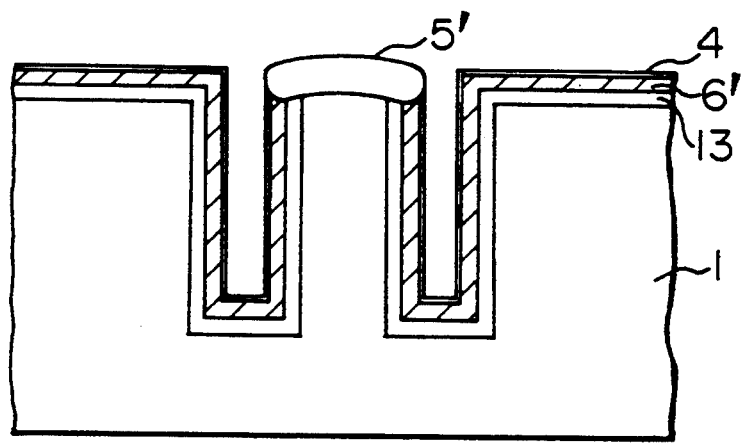

The photoresist is then removed (FIG. 2C), and the portion 24' of the semiconductor film 3 is subjected to thermal oxidation by using the oxidation-resistant film 4 as a mask to form the element isolation insulating film 5' (FIG. 2D). The subsequent steps are the same as those of the first embodiment.

I claim:
1. A method of manufacturing a semiconductor memory device including at least one memory cell having a transistor and a capacitor, said method comprising the steps of:
   forming at least one trench in a surface of a semiconductor substrate;
   forming a semiconductor film covering the surface of said semiconductor substrate and an inner wall of said trench;
   forming an oxidation-resistant film to cover said semiconductor film, said oxidation-resistant film having an opening formed at its area adjacent to said trench;
   oxidizing a part of said semiconductor film, which is exposed at said opening of said oxidation-resistant film, thereby forming an element isolation insulating film; and
   wherein said opening extends to a part of said inner wall of said trench.
2. A method of manufacturing a semiconductor memory device according to claim 1, wherein two trenches are formed in the surface of said semiconductor substrate, and said element isolation insulating film is disposed between said two trenches.
3. A method of manufacturing a semiconductor memory device according to claim 2, wherein said opening is formed at its area disposed between said two trenches.

* * * * *